(12) United States Patent
Hatwar et al.

(10) Patent No.: US 8,057,916 B2
(45) Date of Patent: Nov. 15, 2011

(54) OLED DEVICE WITH IMPROVED PERFORMANCE

(75) Inventors: Tukaram K. Hatwar, Penfield, NY (US); Liang-Sheng Liao, Rochester, NY (US); Yuan-Sheng Tyan, Webster, NY (US); Steven A. Van Slyke, Pittsford, NY (US)

(73) Assignee: Global OLED Technology, LLC., Wilmington, DE (US)

( * ) Notice: Subject to any disclaimer, the term of this patent is extended or adjusted under 35 U.S.C. 154(b) by 719 days.

(21) Appl. No.: 11/110,205

(22) Filed: Apr. 20, 2005

(65) Prior Publication Data

US 2006/0240278 A1    Oct. 26, 2006

(51) Int. Cl.
*H01L 51/54*    (2006.01)
(52) U.S. Cl. ......... 428/690; 428/917; 313/504; 313/506
(58) Field of Classification Search .................. 428/690, 428/917; 427/58, 66; 313/502–509; 257/40, 257/88–103, E51.001–E51.052; 252/301.16–301.35
See application file for complete search history.

(56) References Cited

U.S. PATENT DOCUMENTS

| | | | |
|---|---|---|---|
| 3,180,730 A | 4/1965 | Klupfel et al. | |
| 3,567,450 A | 3/1971 | Brantly et al. | |
| 3,658,520 A | 4/1972 | Brantly et al. | |
| 4,356,429 A | 10/1982 | Tang | |
| 4,539,507 A | 9/1985 | Vanslyke et al. | |
| 4,720,432 A | 1/1988 | Vanslyke et al. | |
| 4,769,292 A | 9/1988 | Tang et al. | |
| 4,885,211 A | 12/1989 | Tang et al. | |
| 5,059,861 A | 10/1991 | Littman et al. | |
| 5,059,862 A | 10/1991 | VanSlyke et al. | |
| 5,061,569 A | 10/1991 | Vanslyke et al. | |
| 5,121,029 A | 6/1992 | Hosokawa et al. | |
| 5,141,671 A | 8/1992 | Bryan et al. | |
| 5,150,006 A | 9/1992 | Van Slyke et al. | |
| 5,151,629 A | 9/1992 | VanSlyke et al. | |
| 5,247,190 A | 9/1993 | Friend et al. | |

(Continued)

FOREIGN PATENT DOCUMENTS

EP    0 732 868    9/1996

(Continued)

OTHER PUBLICATIONS

Kenny, Peter W., "Prediction of planarity and reduction potential of derivatives of tetracyanoquinodimethane using ab initio molecular orbital theory," Journal of the Chemical Society, Perkin Transactions 2, No. 5, pp. 907-909, 1995.*

(Continued)

*Primary Examiner* — Dawn L. Garrett
(74) *Attorney, Agent, or Firm* — McKenna Long & Aldridge, LLP.

(57) ABSTRACT

An OLED device includes an anode, a cathode, and at least one individually selected organic light-emitting layer disposed between the anode and cathode. The device also includes an electron-transporting layer disposed between the at least one light-emitting layer and the cathode, such electron-transporting layer including a first electron-transporting material, and an electron-injecting layer disposed between the electron-transporting layer and the cathode, such electron-injecting layer including a metal dopant having a work function less than 4.0 eV and an electron-transporting material that is different from the first electron-transporting material.

15 Claims, 8 Drawing Sheets

U.S. PATENT DOCUMENTS

| | | | |
|---|---|---|---|
| 5,276,380 A | 1/1994 | Tang | |
| 5,283,182 A | 2/1994 | Powell et al. | |
| 5,294,870 A | 3/1994 | Tang et al. | |
| 5,405,709 A | 4/1995 | Littman et al. | |
| 5,458,977 A | 10/1995 | Hosokawa et al. | |
| 5,484,922 A | 1/1996 | Moore et al. | |
| 5,503,910 A | 4/1996 | Matsuura et al. | |
| 5,593,788 A | 1/1997 | Shi et al. | |
| 5,608,287 A | 3/1997 | Hung et al. | |
| 5,645,948 A | 7/1997 | Shi et al. | |
| 5,677,572 A | 10/1997 | Hung et al. | |
| 5,683,823 A | 11/1997 | Shi et al. | |
| 5,688,551 A | 11/1997 | Littman et al. | |
| 5,703,436 A | 12/1997 | Forrest et al. | |
| 5,714,838 A | 2/1998 | Haight et al. | |
| 5,739,545 A | 4/1998 | Guha et al. | |
| 5,755,999 A | 5/1998 | Shi et al. | |
| 5,776,622 A | 7/1998 | Hung et al. | |
| 5,776,623 A | 7/1998 | Hung et al. | |
| 5,837,391 A | 11/1998 | Utsugi | |
| 5,851,709 A | 12/1998 | Grande et al. | |
| 5,927,247 A | 7/1999 | Tanaka | |
| 5,928,802 A | 7/1999 | Shi et al. | |
| 5,935,720 A | 8/1999 | Chen et al. | |
| 5,935,721 A | 8/1999 | Shi et al. | |
| 5,969,474 A | 10/1999 | Arai | |
| 5,981,306 A | 11/1999 | Burrows et al. | |
| 6,013,384 A | 1/2000 | Kido et al. | |
| 6,020,078 A | 2/2000 | Chen et al. | |
| 6,066,357 A | 5/2000 | Tang et al. | |
| 6,097,147 A | 8/2000 | Baldo et al. | |
| 6,107,734 A | 8/2000 | Tanaka et al. | |
| 6,127,004 A | 10/2000 | Hatwar et al. | |
| 6,137,223 A | 10/2000 | Hung et al. | |
| 6,140,763 A | 10/2000 | Hung et al. | |
| 6,172,459 B1 | 1/2001 | Hung et al. | |
| 6,208,075 B1 | 3/2001 | Hung et al. | |
| 6,208,077 B1 | 3/2001 | Hung | |
| 6,237,529 B1 | 5/2001 | Spahn et al. | |
| 6,278,236 B1 | 8/2001 | Madathil et al. | |
| 6,284,393 B1 | 9/2001 | Hosokawa et al. | |
| 6,337,492 B1 | 1/2002 | Jones et al. | |
| 6,352,791 B1 * | 3/2002 | Fink et al. | 428/690 |
| 6,413,656 B1 | 7/2002 | Thompson et al. | |
| 6,451,415 B1 | 9/2002 | Forrest et al. | |
| 6,451,455 B1 | 9/2002 | Thompson et al. | |
| 6,458,475 B1 | 10/2002 | Adachi et al. | |
| 6,465,115 B2 | 10/2002 | Shi et al. | |
| 6,475,648 B1 | 11/2002 | Hatwar et al. | |
| 6,509,109 B1 | 1/2003 | Nakamura et al. | |
| 6,515,298 B2 | 2/2003 | Forrest et al. | |
| 6,534,199 B1 | 3/2003 | Hosokawa et al. | |
| 6,566,807 B1 | 5/2003 | Fujita et al. | |
| 6,573,651 B2 | 6/2003 | Adachi et al. | |
| 6,589,673 B1 | 7/2003 | Kido et al. | |
| 6,627,333 B2 * | 9/2003 | Hatwar | 428/690 |
| 6,660,411 B2 * | 12/2003 | Sato et al. | 428/690 |
| 6,661,023 B2 | 12/2003 | Hoag et al. | |
| 6,696,177 B1 | 2/2004 | Hatwar | |
| 6,713,192 B2 | 3/2004 | Fukuoka et al. | |
| 6,717,358 B1 | 4/2004 | Liao et al. | |
| 6,720,092 B2 | 4/2004 | Hatwar | |
| 6,720,573 B2 | 4/2004 | Son et al. | |
| 6,759,146 B2 * | 7/2004 | Aziz et al. | 428/690 |
| 7,179,543 B2 * | 2/2007 | Forrest et al. | 428/690 |
| 2001/0008711 A1 * | 7/2001 | Igarashi | 428/690 |
| 2001/0053462 A1 * | 12/2001 | Mishima | 428/690 |
| 2002/0025419 A1 | 2/2002 | Lee et al. | |
| 2002/0048687 A1 | 4/2002 | Hosokawa et al. | |
| 2002/0100906 A1 | 8/2002 | Takiguchi et al. | |
| 2002/0117662 A1 | 8/2002 | Nii | |
| 2002/0121638 A1 | 9/2002 | Grushin et al. | |
| 2002/0127427 A1 | 9/2002 | Young et al. | |
| 2002/0186214 A1 | 12/2002 | Siwinski | |
| 2002/0197511 A1 | 12/2002 | D Andrade et al. | |
| 2003/0017361 A1 | 1/2003 | Thompson et al. | |
| 2003/0040627 A1 | 2/2003 | Fujii | |
| 2003/0054198 A1 | 3/2003 | Tsuboyama et al. | |
| 2003/0059646 A1 | 3/2003 | Kamatani et al. | |
| 2003/0068526 A1 | 4/2003 | Kamatani et al. | |
| 2003/0068528 A1 | 4/2003 | Thompson et al. | |
| 2003/0068535 A1 | 4/2003 | Takiguchi et al. | |
| 2003/0072964 A1 | 4/2003 | Kwong et al. | |
| 2003/0072966 A1 | 4/2003 | Hosokawa et al. | |
| 2003/0124381 A1 | 7/2003 | Thompson et al. | |
| 2003/0141809 A1 | 7/2003 | Furugori et al. | |
| 2003/0170491 A1 | 9/2003 | Liao et al. | |
| 2003/0189401 A1 | 10/2003 | Kido et al. | |
| 2003/0198829 A1 | 10/2003 | Hoag et al. | |
| 2003/0203234 A1 | 10/2003 | Shi | |
| 2003/0224202 A1 | 12/2003 | Brown et al. | |
| 2003/0230980 A1 * | 12/2003 | Forrest et al. | 313/600 |
| 2004/0001969 A1 | 1/2004 | Cosimbescu et al. | |
| 2004/0009367 A1 | 1/2004 | Hatwar | |
| 2004/0062949 A1 | 4/2004 | Pfeiffer et al. | |
| 2004/0113875 A1 | 6/2004 | Miller et al. | |
| 2005/0136289 A1 * | 6/2005 | Chu et al. | 428/690 |

FOREIGN PATENT DOCUMENTS

| | | |
|---|---|---|
| EP | 0 891 121 A1 | 1/1999 |
| EP | 1 009 041 | 6/2000 |
| EP | 1 029 909 A1 | 8/2000 |
| EP | 1 076 368 | 2/2001 |
| EP | 1 182 244 | 2/2002 |
| EP | 1 187 235 | 3/2002 |
| EP | 1 238 981 | 9/2002 |
| EP | 1 239 526 | 9/2002 |
| EP | 1 244 155 | 9/2002 |
| JP | 2002-352961 | 12/2002 |
| JP | 2003-059667 | 2/2003 |
| JP | 2003045676 A | 2/2003 |
| JP | 2003-068468 | 3/2003 |
| JP | 2003-073387 | 3/2003 |
| JP | 2003-073388 | 3/2003 |
| JP | 2003-073665 | 3/2003 |
| WO | WO 98/55561 | 12/1998 |
| WO | WO 00/18851 | 4/2000 |
| WO | WO 00/57676 | 9/2000 |
| WO | WO 00/70655 | 11/2000 |
| WO | WO 01/39234 | 5/2001 |
| WO | WO 01/41512 | 6/2001 |
| WO | WO 01/93642 | 12/2001 |
| WO | WO 02/15645 | 2/2002 |
| WO | WO 02/071813 | 9/2002 |
| WO | WO 02/074015 | 9/2002 |
| WO | WO 2004/018587 | 3/2004 |
| WO | WO 2004/061963 | 7/2004 |

OTHER PUBLICATIONS

D'Andrade et al., "Effects of exciton and charge confinement on the performance of white organic p—i—n electrophosphorescent emissive excimer devices," Journal of Applied Physics, vol. 94, No. 5, pp. 3101-3109, Sep. 2003.*

"Organic Electroluminescent Diodes", Applied Physics Letters, 51, 913 (1987).

Adachi et al., "Electroluminescence in Organic Films with Three-Layer Structure", Japanese Journal of Applied Physics, 27, L269 (1988).

Tang et al., "Electroluminescence of Doped Organic Thin Films", Journal of Applied Physics, 65, 3610 (1989).

* cited by examiner

US 8,057,916 B2

OLED DEVICE WITH IMPROVED PERFORMANCE

CROSS REFERENCE TO RELATED APPLICATIONS

Reference is made to commonly assigned U.S. Pat. No. 7,192,659, U.S. Patent Publication No. 2006/0105198, U.S. Pat. No. 7,211,948, and U.S. Publication No. 2006/0240277, the disclosures of which are herein incorporated by reference.

FIELD OF THE INVENTION

The present invention relates to providing an organic electroluminescent device having improved performance.

BACKGROUND OF THE INVENTION

Organic electroluminescent (EL) devices or organic light-emitting diodes (OLEDs) are electronic devices that emit light in response to an applied potential. The structure of an OLED includes, in sequence, an anode, an organic EL unit, and a cathode. The organic EL unit disposed between the anode and the cathode is commonly comprised of an organic hole-transporting layer (HTL) and an organic electron-transporting layer (ETL). Holes and electrons recombine and emit light in the ETL near the interface of HTL/ETL. Tang et al., "Organic Electroluminescent Diodes", *Applied Physics Letters*, 51, 913 (1987), and commonly assigned U.S. Pat. No. 4,769,292 demonstrated highly efficient OLEDs using such a layer structure. Since then, numerous OLEDs with alternative layer structures have been disclosed. For example, there are three layer OLEDs that contain an organic light-emitting layer (LEL) between the HTL and the ETL, such as that disclosed by Adachi et al., "Electroluminescence in Organic Films with Three-Layer Structure", *Japanese Journal of Applied Physics*, 27, L269 (1988), and by Tang et al., "Electroluminescence of Doped Organic Thin Films", *Journal of Applied Physics*, 65, 3610 (1989). The LEL commonly includes a host material doped with a guest material wherein the layer structures are denoted as HTL/LEL/ETL. Further, there are other multilayer OLEDs that contain more functional layers in the devices. At the same time, many kinds of EL materials are also synthesized and used in OLEDs. These new structures and new materials have further resulted in improved device performance.

An OLED is actually a current driven device. Its luminance is proportional to current density, but its lifetime is inversely proportional to current density. In order to achieve high brightness, an OLED has to be operated at a relatively high current density, but this will result in a short lifetime. Thus, it is critical to improve the luminous efficiency of an OLED while operating at the lowest possible current density consistent with the intended luminance requirement to increase the operational lifetime.

In order to dramatically improve luminous efficiency and to increase lifetime in OLED, a tandem OLED (or stacked OLED, or cascaded OLED) structure, which is fabricated by stacking several individual OLEDs vertically and driven by only a single power source, has been fabricated (see U.S. Pat. Nos. 6,337,492, 6,107,734, 6,717,358, U.S. Patent Publication Nos. 2003/0170491 A1, 2003/0189401 A1, and JP Patent Publication No. 2003045676A). In a tandem OLED having a number of N(N>1) EL units, the luminous efficiency can be N times as high as that of a conventional OLED containing only one EL unit (of course, the drive voltage can also be N times as high as that of the conventional OLED). Therefore, in one aspect to achieve long lifetime, the tandem OLED needs only about 1/N of the current density used in the conventional OLED to obtain the same luminance while the lifetime of the tandem OLED will be about N times that of the conventional OLED. In the other aspect to achieve high luminance, the tandem OLED needs only the same current density used in the conventional OLED to obtain a luminance N times as high as that of the conventional OLED while maintaining about the same lifetime.

Although tandem OLEDs have many advantages, one disadvantage is the increased drive voltage. In many electronic systems, e.g., in some active matrix designs, the available voltage is limited. Thus, there is a need to reduce the voltage necessary to drive tandem OLEDs. One way to lower driving voltage in a tandem OLED is to provide an electron-injecting layer (EIL), which typically includes an electron-transporting material doped with an n-type dopant such as a low-work function metal. For example, see U.S. Pat. Nos. 6,013,384, 6,509,109, 6,566,807, and 6,589,673. The EIL is provided between the cathode and the light-emitting layer, and typically in contact with the cathode. However, the metallic dopant can cause excited-state quenching and lower the luminance efficiency. This occurs if the EIL is directly on the light-emitting layer, or if the electron-transporting material selected for the EIL does not effectively bind the metal dopant, thus permitting diffusion of the metal into the light-emitting layer. Such a situation also shortens the lifetime of the OLED device. The problem of lowering voltage is not just limited to tandem OLED devices.

In addition to continued need to provide OLEDs having improved lifetime and efficiency, it is desirable to improve manufacturability of OLED devices. One way to simplify manufacturing is to limit shadow mask patterning and instead provide a white or broadband light-emitting OLED with color filters. For lowest power consumption, it is often advantageous for the chromaticity of the white light-emitting OLED to be close to CIE $D_{65}$, i.e., CIE x=0.31 and CIE y=0.33. This is particularly the case for so-called RGBW displays having red, green, blue, and white pixels. However, many white or broadband OLED devices have multiple emissive layers, which results in higher drive voltage. Thus, there is a need to reduce the drive voltage and still achieve a desirable white point.

SUMMARY OF THE INVENTION

It is an object of the present invention to make an OLED device having a low drive voltage, high efficiency, and long lifetime.

It is another object of the present invention to make a broadband or white light-emitting OLED device having a low drive voltage, high efficiency, long lifetime, and appropriate chromaticity.

It is a further object of the present invention to make a tandem OLED device having a low drive voltage, high efficiency, and long lifetime.

It is a still further object of the present invention to make a tandem broadband or white light-emitting OLED device having a low drive voltage, high efficiency, long lifetime, and appropriate chromaticity.

These objects are achieved by an OLED device, comprising:

a) an anode;

b) a cathode;

c) at least one individually selected organic light-emitting layer disposed between the anode and cathode;

d) an electron-transporting layer disposed between the at least one light-emitting layer and the cathode, such electron-transporting layer including a first electron-transporting material; and e) an electron-injecting layer disposed between the electron-transporting layer and the cathode, such electron-injecting layer including a metal dopant having a work function less than 4.0 eV and an electron-transporting material that is different from the first electron-transporting material.

Figure 1:
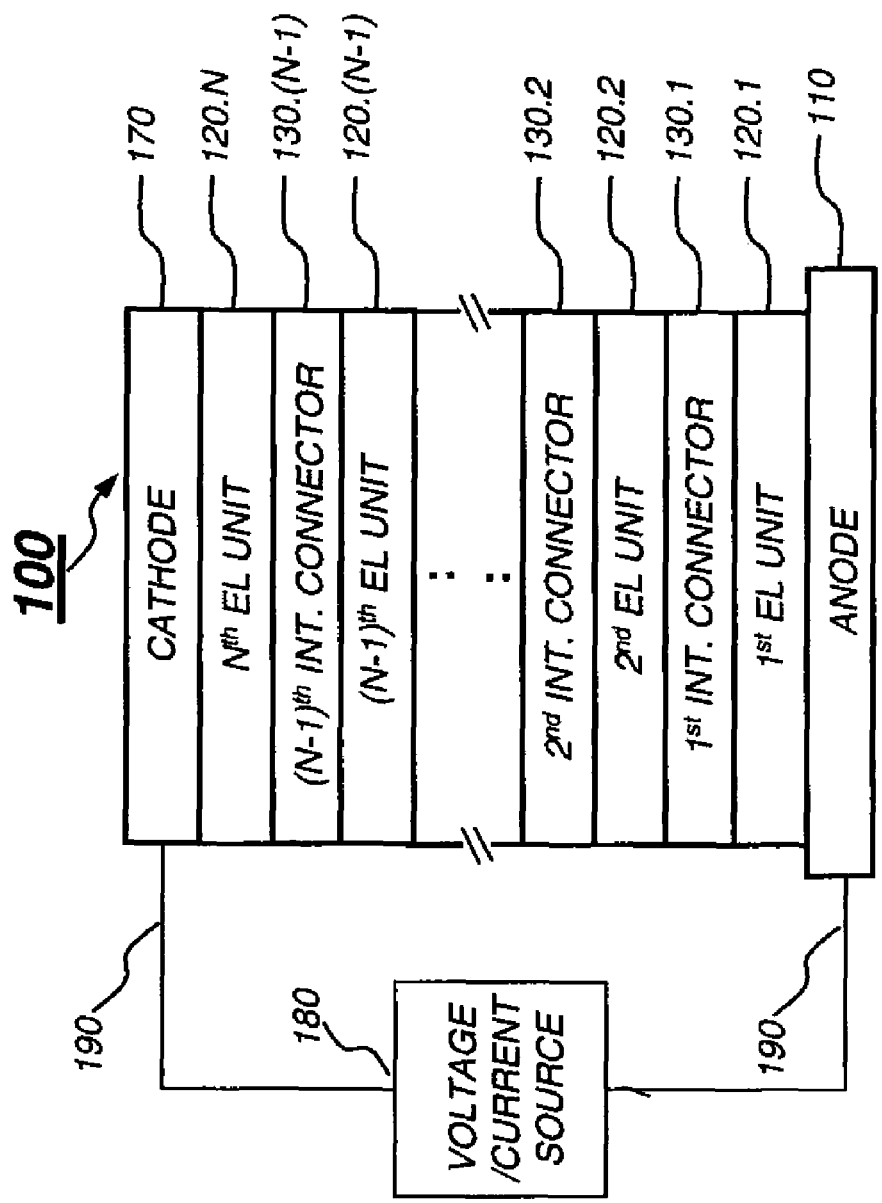
FIG. 1 depicts a schematic cross sectional view of a tandem OLED, having N(N≧1) EL units connected in series by N−1 intermediate connectors.
Figure 2:
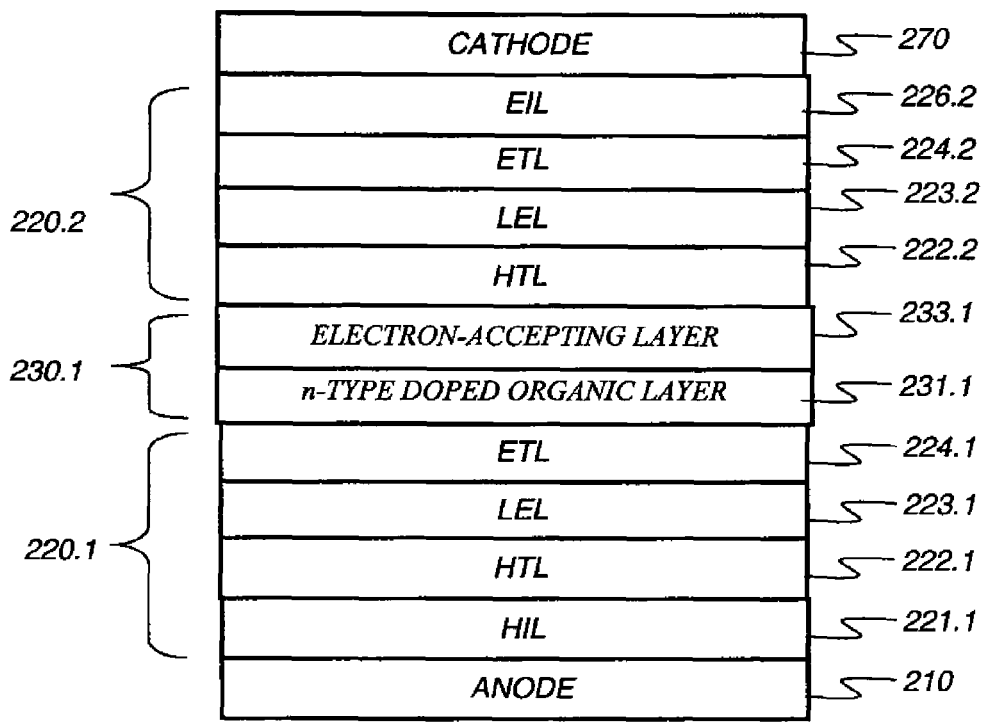
FIG. 2 depicts a schematic cross sectional view of a specific tandem OLED, having two EL units connected in series by an intermediate connector.

It will be understood that FIGS. 1-3 are not to scale since the individual layers are too thin and the thickness differences of various layers too great to permit depiction to scale.

DETAILED DESCRIPTION OF THE INVENTION

Several terms to be used in the following description are explained herein. The term "full color" is employed to describe the emission color in the red, green, and blue regions of the visible spectrum. The red, green, and blue colors constitute the three primary colors from which other colors can be produced by appropriate mixing. Broadband emission is light that has significant components in multiple portions of the visible spectrum, for example, blue and green. Broadband emission can also include the situation where light is emitted in the red, green, and blue portions of the spectrum in order to produce white light. White light is that light that is perceived by a user as having a white color, or light that has an emission spectrum sufficient to be used in combination with color filters to produce a practical full color displays. Although the white light can have a strong hue and still be useful, preferably, white color has Commission Internationale de l'Eclairage (CIE) coordinates of about CIE x=0.31±0.05 and CIE y=0.33±0.05. This is the color of a $D_{65}$ white, which is particularly advantages for RGBW displays having red, green, blue, and white pixels as described in WO 2004/061963. The term "pixel" is employed in its art recognized usage to designate an area of a display panel that can be stimulated to emit light independently. The term "n-type doped organic layer" means that the organic layer has semiconducting properties after doping, and the electrical current through this layer is substantially carried by the electrons. The term "p-type doped organic layer" means that the organic layer has semiconducting properties after doping, and the electrical current through this layer is substantially carried by the holes. A "high work function metal" is defined as a metal having a work function no less than 4.0 eV. Likewise, a "low work function metal" is defined as a metal having a work function less than 4.0 eV.

Although the present invention can be employed for any OLED, it is conveniently discussed in terms of a tandem OLED. FIG. 1 shows a tandem OLED 100 in accordance with the present invention. This tandem OLED has an anode 110 and a cathode 170, at least one of which is transparent. Disposed between the anode and the cathode are N EL units and N−1 intermediate connector (each of them indicated as "int. connector" in the figure), where N is an integer greater than 1. The EL units, stacked and connected serially, are designated 120.1 to 120.N, where 120.1 is the first EL unit (adjacent to the anode), 120.2 is the second EL unit, 120.(N−1) is the (N−1)$^{th}$ EL unit, and 120.N is the N$^{th}$ EL unit (nearby the cathode). The intermediate connectors, disposed between the EL unit, are designated 130.1 to 130.(N−1), where 130.1 is the first intermediate connector disposed between EL units 120.1 and 120.2; 130.2 is the second intermediate connector in contact with EL unit 120.2 and another EL unit (not shown in the figure); and 130.(N−1) is the last intermediate connector disposed between EL units 120.(N−1) and 120.N. The tandem OLED 100 is externally connected to a voltage/current source 180 through electrical conductors 190.

The anode 110 and cathode 170 are connected to the voltage/current source 180 through electrical conductors 190. Tandem OLED 100 is operated by applying an electric potential produced by a voltage/current source 180 between a pair of contact electrodes, anode 110 and cathode 170. Under a forward bias of (V×N), this externally applied electrical potential is distributed among the N EL units and the N−1 intermediate connectors. The electric potential (V×N) across the tandem OLED enables the electrons (negatively charged carriers) to have a potential energy of eV×N (relative to the electrical potential of the anode) when they are injected from the cathode into the N$^{th}$ EL unit. In this N$^{th}$ EL unit, those electrons are transporting onto the LUMO of the LEL before a radiative recombination with the holes (positively charged carriers) on the HOMO of the LEL. During the recombination process, the electrons fall down from the LUMO onto the HOMO of the LEL and lose a portion of their potential energy by producing photons. After the 1$^{st}$ radiative recombination, the electrons are continually transporting from the HOMO of the LEL to the HOMO of the HTL, and then are injected into the (N−1)$^{th}$ intermediate connector. The electrons remain a potential energy of about eV×(N−1) when they are injected from the (N−1)$^{th}$ intermediate connector into the (N−1)$^{th}$ EL unit. This "injection-transport-recombination-transport" process happens in each of the EL units before the electrons eventually are injected into the anode. During the energetically cascading "journey" from the cathode to the anode via the N EL units and the (N−1) intermediate connectors, the electrons can have N times of radiative recombinations to produce photons. In other words, each of the injected electrons from the cathode can have a chance to produce N photons.

Each of the EL units in the tandem OLED 100 is capable of supporting hole injection, hole transport, electron injection, electron transport, and electron-hole recombination to produce light. Each of the EL units can comprise a plurality of layers. Such layers can include a hole-injecting layer (HIL), a hole-transporting layer (HTL), a light-emitting layer (LEL), an electron-transporting layer (ETL), an electron-injecting layer (EIL), hole-blocking layer (HBL), electron-blocking layer (EBL), an exciton-blocking layer (XBL), and others known in the art. Various layers can serve multiple functions (e.g., an ETL can also serve as an HBL), and there can be multiple layers that have a similar function (e.g., there can be several LELs, ETLs). There are many organic EL multilayer structures known in the art that can be used as EL units of the present invention. Some non-limiting examples include, HTL/LEL(s)/EIL, HIL/HTL/LEL(s)/ETL/EIL, HIL/HTL/EBL or XBL/LEL(s)/ETL/EIL, and HIL/HTL/LEL(s)/HBL/ETL/EIL. Each of the EL units in the tandem OLED can have the same or different layer structures from other EL units. Preferably, the layer structure of the EL units is of HTL/LEL(s)/ETL, wherein the EL unit adjacent to the anode has a HIL between the anode and the HTL, and wherein the EL unit adjacent to the cathode has an EIL disposed between the cathode and the ETL. Considering the number of the LELs within a specific EL unit, the number of LELs in each of the EL units can be changed typically from 1 to 3. Moreover, each of the EL units in the tandem OLED can emit the same or different color.

The present invention is more clearly set forth in the embodiment shown in FIG. 2. Tandem OLED device 200 has a first EL unit 220.1 and a second EL unit 220.2 connected in series by intermediate connector 230.1. The first EL unit in this arrangement includes HIL 221.1 (adjacent to the anode 210), HTL 222.1, LEL 223.1, and ETL 224.1. The intermediate connector 230.1 includes n-type doped organic layer 231.1 and electron-accepting layer 233.1. A second EL unit 220.2 includes HTL 222.2, LEL 223.2, ETL 224.2, and EIL 226.2. Cathode 270 is provided over EIL 226.2. For clarity, the power supply and electrical conductors are not shown.

An important feature of this invention is that the EIL 226.2 is adjacent to ETL 224.2 and contains and electron-transporting material that is different from the electron-transporting material used in the ETL. Some reasons for using different electron-transporting materials are discussed below, but first, useful materials and constructions for the various layers are discussed.

The HTL contains at least one hole-transporting material such as an aromatic tertiary amine, where the aromatic tertiary amine is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals or at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described by VanSlyke et al. in U.S. Pat. Nos. 4,720,432 and 5,061,569. The HTL can be formed of a single or a mixture of aromatic tertiary amine compounds. Illustrative of useful aromatic tertiary amines are the following:
1,1-Bis(4-di-p-tolylaminophenyl)cyclohexane;
1,1-Bis(4-di-p-tolylaminophenyl)-4-phenylcyclohexane;
N,N,N',N'-tetraphenyl-4,4'''-diamino-1,1':4',1'':4'',1'''-quaterphenyl;
Bis(4-dimethylamino-2-methylphenyl)phenylmethane;
1,4-bis[2-[4-[N,N-di(p-toly)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(1-naphthyl)-N-phenylamino]$_p$-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4'''-diamino-p-terphenyl;
4,4'-Bis{N-phenyl-N-[4-(1-naphthyl)-phenyl]amino}biphenyl;
2,6-Bis[N,N-di(2-naphthyl)amino]fluorene;
4,4',4''-tris[(3-methylphenyl)phenylamino]triphenylamine (MTDATA); and
4,4'-Bis[N-(3-methylphenyl)-N-phenylamino]biphenyl (TPD).

Another class of useful hole-transporting materials includes polycyclic aromatic compounds as described in EP 1 009 041. Tertiary aromatic amines with more than two amino groups can be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

The LEL includes a luminescent fluorescent or phosphorescent material where electroluminescence is produced as a result of electron-hole pair recombination in this region. The light-emitting layer can be comprised of a single material, but more commonly contains a host material doped with a guest emitting material or materials where light emission comes primarily from the emitting materials and can be of any color. This guest emitting material is often referred to as a light-emitting dopant. The host materials in the light-emitting layer can be an electron-transporting material, as defined below, a hole-transporting material, as defined above, or another material or combination of materials that support hole-electron recombination. The emitting material is typically chosen from highly fluorescent dyes and phosphorescent compounds, e.g., transition metal complexes as described in WO 98/55561, WO 00/18851, WO 00/57676, and WO 00/70655. Emitting materials are typically incorporated at 0.01 to 10% by weight of the host material.

The host and emitting materials can be small nonpolymeric molecules or polymeric materials including polyfluorenes and polyvinylarylenes, e.g., poly(p-phenylenevinylene), PPV. In the case of polymers, small molecule emitting materials can be molecularly dispersed into a polymeric host, or the emitting materials can be added by copolymerizing a minor constituent into a host polymer.

An important relationship for choosing an emitting material is a comparison of the bandgap potential which is defined as the energy difference between the highest occupied molecular orbital and the lowest unoccupied molecular orbital of the molecule. For efficient energy transfer from the host to the emitting material, a necessary condition is that the band gap of the dopant is smaller than that of the host material. For phosphorescent emitters (including materials that emit from a triplet excited state, i.e., so-called "triplet emitters") it is also important that the host triplet energy level of the host be high enough to enable energy transfer from host to emitting material.

Host and emitting materials known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, 6,020,078, 6,475,648, 6,534,199, 6,661,023, U.S. Patent Application Publications 2002/0127427 A1, 2003/0198829 A1, 2003/0203234 A1, 2003/0224202 A1, and 2004/0001969 A1.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)];
CO-2: Magnesium bisoxine [alias, bis(8-quinolinolato)magnesium(II)];
CO-3: Bis[benzo{f}-8-quinolinolato]zinc (II);
CO-4: Bis(2-methyl-8-quinolinolato)aluminum(III)-μ-oxo-bis(2-methyl-8-quinolinolato) aluminum(III);
CO-5: Indium trisoxine [alias, tris(8-quinolinolato)indium];
CO-6: Aluminum tris(5-methyloxine) [alias, tris(5-methyl-8-quinolinolato) aluminum(III)];
CO-7: Lithium oxine [alias, (8-quinolinolato)lithium(I)];
CO-8: Gallium oxine [alias, tris(8-quinolinolato)gallium (III)]; and
CO-9: Zirconium oxine [alias, tetra(8-quinolinolato)zirconium(IV)].

Another class of useful host materials includes derivatives of anthracene, such as those described in U.S. Pat. Nos. 5,935,721, 5,972,247, 6,465,115, 6,534,199, 6,713,192, U.S. Patent Application Publications 2002/0048687 A1, 2003/0072966 A1, and WO 2004/018587 A1. Some examples include derivatives of 9,10-dinaphthylanthracene derivatives and 9-naphthyl-10-phenylanthracene. Other useful classes of host materials include distyrylarylene derivatives as described in U.S. Pat. No. 5,121,029, and benzazole derivatives, for example, 2,2',2"-(1,3,5-phenylene)tris[1-phenyl-1H-benzimidazole].

Desirable host materials are capable of forming a continuous film. The light-emitting layer can contain more than one host material in order to improve the device's film morphology, electrical properties, light emission efficiency, and lifetime. Mixtures of electron-transporting and hole-transporting materials are known as useful hosts. In addition, mixtures of the above listed host materials with hole-transporting or electron-transporting materials can make suitable hosts.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrilium compounds, fluorene derivatives, periflanthene derivatives, indenoperylene derivatives, bis(azinyl)amine boron compounds, bis (azinyl)methane boron compounds, derivatives of distryrylbenzene and distyrylbiphenyl, and carbostyryl compounds. Among derivatives of distyrylbenzene, particularly useful are those substituted with diarylamino groups, informally known as distyrylamines.

Suitable host materials for phosphorescent emitters (including materials that emit from a triplet excited state, i.e., so-called "triplet emitters") should be selected so that the triplet exciton can be transferred efficiently from the host material to the phosphorescent material. For this transfer to occur, it is a highly desirable condition that the excited state energy of the phosphorescent material be lower than the difference in energy between the lowest triplet state and the ground state of the host. However, the band gap of the host should not be chosen so large as to cause an unacceptable increase in the drive voltage of the OLED. Suitable host materials are described in WO 00/70655 A2, WO 01/39234 A2, WO 01/93642 A1, WO 02/074015 A2, WO 02/15645 A1, and U.S. Patent Application Publication 2002/0117662 A1. Suitable hosts include certain aryl amines, triazoles, indoles, and carbazole compounds. Examples of desirable hosts are 4,4'-N,N'-dicarbazole-biphenyl (CBP), 2,2'-dimethyl-4,4'-N,N'-dicarbazole-biphenyl, m-(N,N'-dicarbazole)benzene, and poly(N-vinylcarbazole), including their derivatives.

Examples of useful phosphorescent materials that can be used in light-emitting layers of this invention include, but are not limited to, those described in WO 00/57676 A1, WO 00/70655 A1, WO 01/41512 A1, WO 02/15645 A1, WO 01/93642A1, WO 01/39234 A2, WO 02/074015 A2, WO 02/071813 A1, U.S. Pat. Nos. 6,458,475, 6,573,651, 6,451,455, 6,413,656, 6,515,298, 6,451,415, 6,097,147, U.S. Patent Application Publications 2003/0017361 A1, 2002/0197511 A1, 2003/0072964 A1, 2003/0068528 A1, 2003/0124381 A1, 2003/0059646 A1, 2003/0054198 A1, 2002/0100906 A1, 2003/0068526 A1, 2003/0068535 A1, 2003/0141809 A1, 2003/0040627 A1, 2002/0121638 A1, EP 1 239 526 A2, EP 1 238 981 A2, EP 1 244 155 A2, JP 2003073387A, JP 2003073388A, JP 2003059667A, and JP 2003073665A. Useful phosphorescent dopants include, but are not limited to, transition metal complexes, such as iridium and platinum complexes.

In some cases it is useful for one or more of the LELs within an EL unit to emit broadband light, for example white light. Multiple dopants can be added to one or more layers in order to produce a white-emitting OLED, for example, by combining blue- and yellow-emitting materials, cyan- and red-emitting materials, or red-, green-, and blue-emitting materials. White-emitting devices are described, for example, in EP 1 187 235, EP 1 182 244, U.S. Pat. Nos. 5,683,823, 5,503,910, 5,405,709, 5,283,182, 6,627,333, 6,696,177, 6,720,092, U.S. Patent Application Publications 2002/0186214 A1, 2002/0025419 A1, and 2004/0009367 A1. In preferred embodiments, white light is produced by multiple LELs. In some of these systems, the host for one light-emitting layer is a hole-transporting material.

The ETL can contain one or more metal chelated oxinoid compounds, including chelates of oxine itself, also commonly referred to as 8-quinolinol or 8-hydroxyquinoline. Such compounds help to inject and transport electrons, exhibit high levels of performance, and are readily deposited to form thin films. Exemplary oxinoid compounds have been listed above from CO-1 to CO-9.

Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, phenanthroline derivatives, and some silole derivatives are also useful electron-transporting materials.

Each of the layers in the EL unit can be formed from small molecule OLED materials, or polymeric LED materials, or combinations thereof. Some EL units can be polymeric and other units can be of small molecules (or nonpolymeric), including fluorescent materials and phosphorescent materials. The corresponding layer in each of the EL units in a tandem OLED can be formed using the same or different materials from those of the other corresponding layers, and can have the same or different layer thicknesses.

For a tandem OLED to function efficiently, the intermediate connector should provide effective carrier injection into the adjacent EL units. It is also preferred that the optical transparency of the layers constituting the intermediate connector should be as high as possible to permit for radiation produced in the EL units to exit the device. There are several useful configurations for the intermediate connector, but in every case, the intermediate connector includes at least an n-type doped organic layer.

Figure 3A:
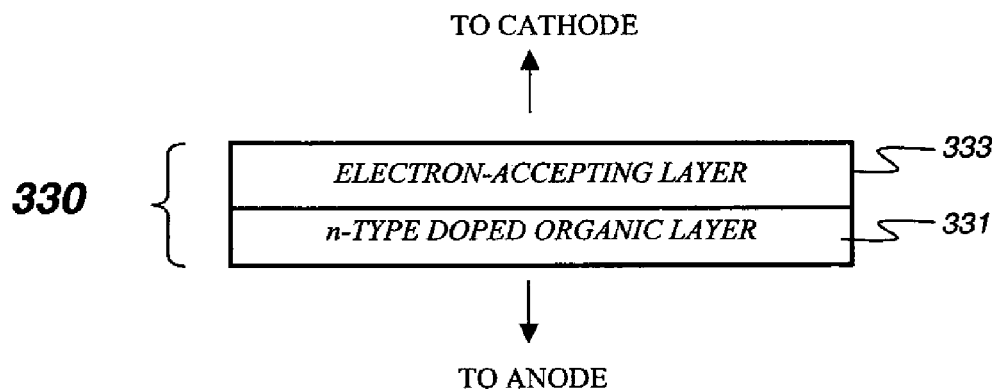
FIGS. 3A-3G depict a schematic cross sectional views of specific intermediate connector configuration.
Figure 3B:
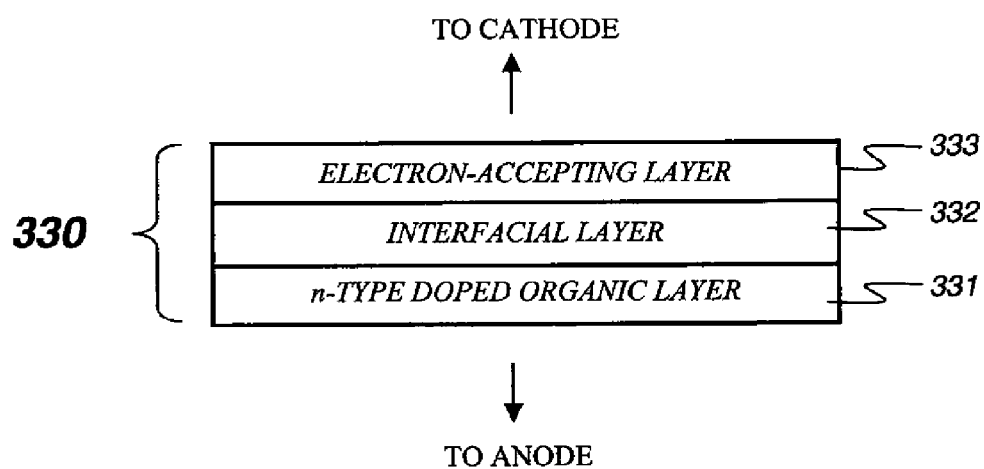
Figure 3C:
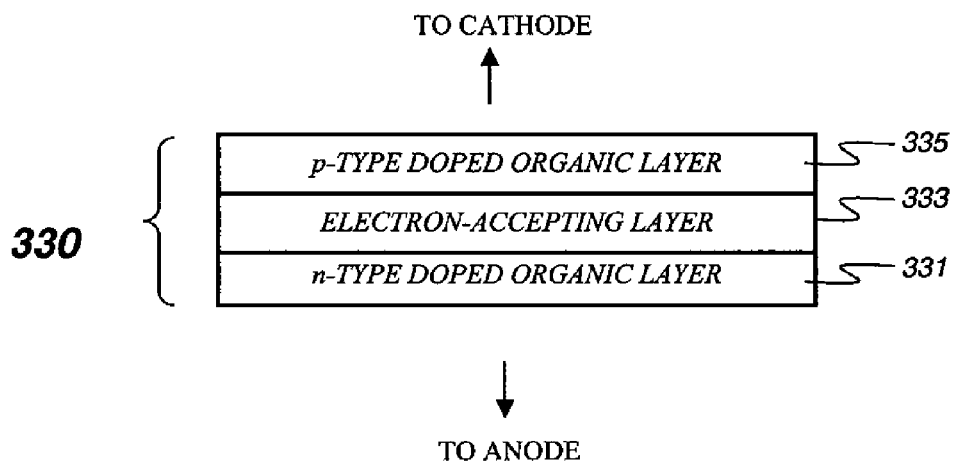
Figure 3D:
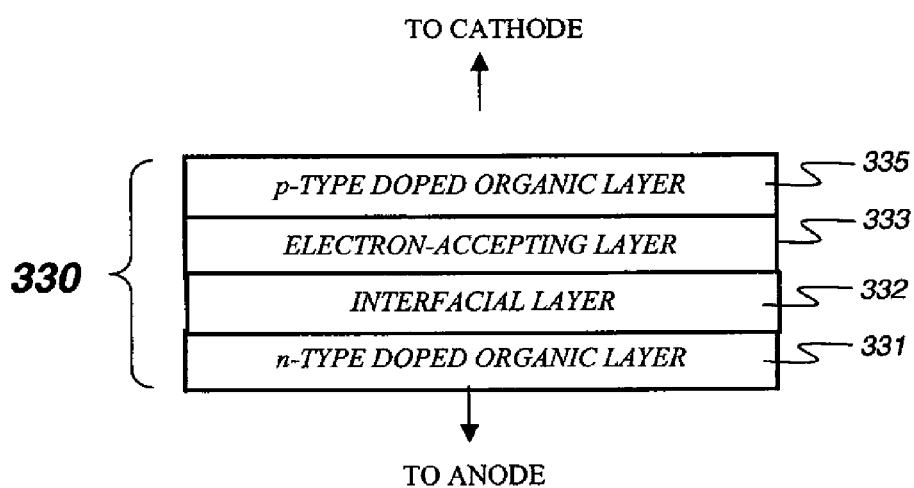
Figure 3E:
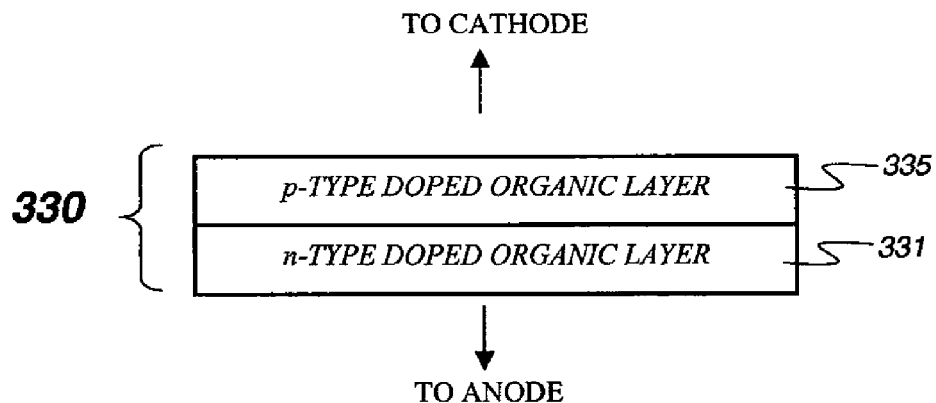
Figure 3F:
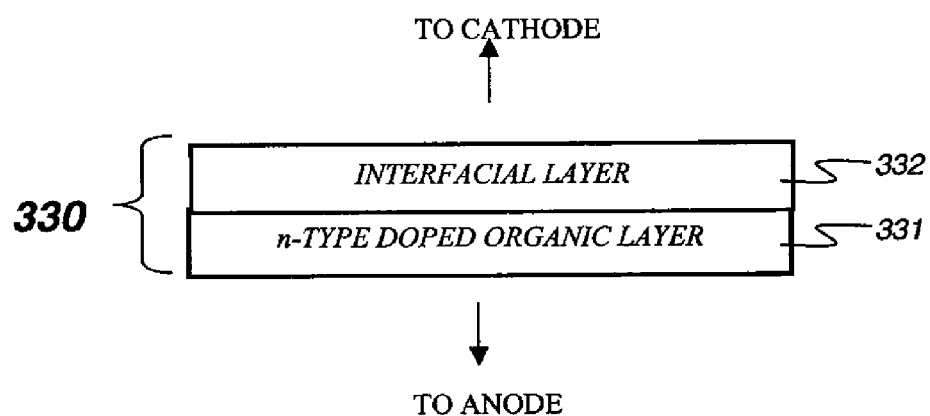
Figure 3G:
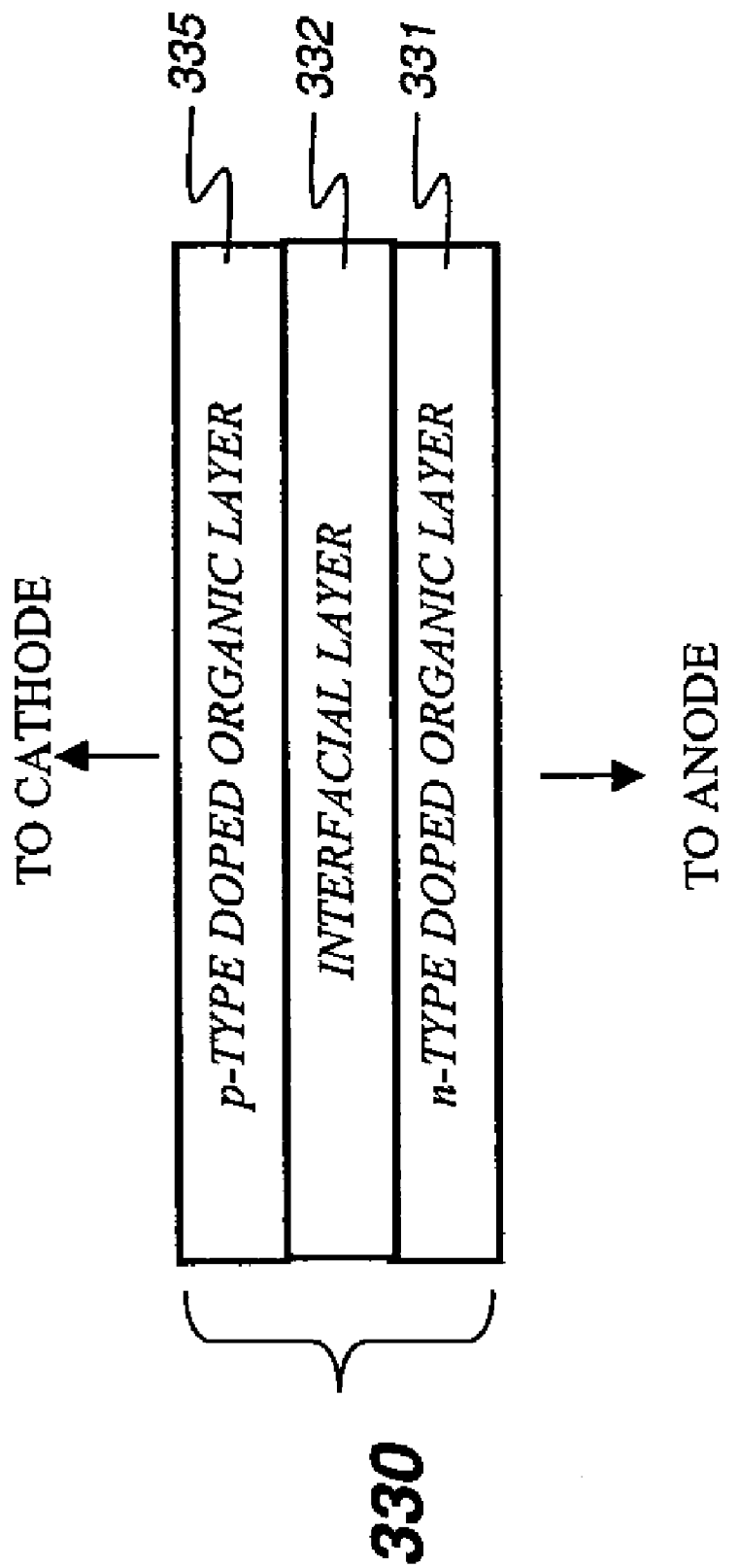

As shown in FIG. 3A, intermediate connector 330 can have two layers including an n-type doped organic layer 331 and an electron-accepting layer 333. The electron-accepting layer 333 is disposed closer to the cathode than the n-type doped organic layer 331. These two layers can be in contact, or they can be separated by an interfacial layer 332, as shown in FIG. 3B. The intermediate connector 330 can also have a p-type doped organic layer 335 disposed over the electron-accepting layer 333, as shown in FIG. 3C. The p-type doped organic layer 335 is closer to the cathode than the electron-accepting layer 333. Preferably, the p-type doped organic layer 335 is in contact with the electron-accepting layer 333. The intermediate connector 330 can have both an interfacial layer 332 and a p-type doped organic layer 335 as shown in FIG. 3D. Alternatively, the intermediate connector can include: an n-type doped organic layer adjacent to a p-type doped organic layer (FIG. 3E); an n-type doped organic layer and a interfacial layer (FIG. 3F); an n-type doped organic layer, an interfacial layer, and an p-type doped organic layer (FIG. 3G).

The n-type doped organic layer contains at least one electron-transporting material as a host material and at least one n-type dopant. The term "n-type doped organic layer" means that this layer has semiconducting properties after doping, and the electrical current through this layer is substantially carried by the electrons. The host material is capable of supporting electron injection and electron transport. The electron-transporting materials defined previously for use in the ETL represent a useful class of host materials for the n-type doped organic layer. Preferred materials are metal chelated oxinoid compounds, including chelates of oxine itself (also commonly referred to as 8-quinolinol or 8-hydroxyquinoline), such as tris(8-hydroxyquinoline)aluminum (Alq). Other materials include various butadiene derivatives as disclosed by Tang in U.S. Pat. No. 4,356,429, various heterocyclic optical brighteners as disclosed by VanSlyke et al. in U.S. Pat. No. 4,539,507, triazines, hydroxyquinoline derivatives, benzazole derivatives, and phenanthroline derivatives. Silole derivatives, such as 2,5-bis(2',2"-bipridin-6-yl)-1,1-dimethyl-3,4-diphenyl silacyclopentadiene are also useful host organic materials. In some instances it is useful to combine two or more hosts to obtain the proper charge injection and stability properties. More specific examples of useful host materials in the n-type organic doped layer include Alq, 4,7-diphenyl-1,10-phenanthroline (Bphen), 2,9-dimethyl-4,7-diphenyl-1,10-phenanthroline (BCP), or 2,2'-[1,1'-biphenyl]-4,4'-diylbis[4,6-(p-tolyl)-1,3,5-triazine] (TRAZ), or combinations thereof.

The n-type dopant in the n-type doped organic layer includes alkali metals, alkali metal compounds, alkaline earth metals, or alkaline earth metal compounds, or combinations thereof. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Th, Dy, or Yb, and their compounds, are particularly useful. The materials used as the n-type dopants in the n-type doped organic layer also include organic reducing agents with strong electron-donating properties. By "strong electron-donating properties" it is meant that the organic dopant should be able to donate at least some electronic charge to the host to form a charge-transfer complex with the host. Nonlimiting examples of organic molecules include bis(ethylenedithio)-tetrathiafulvalene (BEDT-TTF), tetrathiafulvalene (TTF), and their derivatives. In the case of polymeric hosts, the dopant can be any of the above or also a material molecularly dispersed or copolymerized with the host as a minor component. Preferably, the n-type dopant in the n-type doped organic layer includes Li, Na, K, Rb, Cs, Mg, Ca, Sr, Ba, La, Ce, Nd, Sm, Eu, Th, Dy, or Yb, or combinations thereof. The n-type doped concentration is preferably in the range of 0.01-20% by volume. The thickness of the n-type doped organic layer is typically less than 200 nm, and preferably less than 100 nm.

The electron-accepting layer (if used) of the intermediate connector includes one or more organic materials, each having an electron-accepting property and a reduction potential greater than −0.5 V vs. a Saturated Calomel Electrode (SCE), and wherein the one or more organic materials provide more than 50% by volume in the intermediate connector. Preferably, electron-accepting layer 333 includes one or more organic materials having a reduction potential greater than −0.1 V vs. SCE. More preferably, electron-accepting layer 333 includes a single organic material having an electron-accepting property and a reduction potential greater than −0.1 V vs. SCE. By "electron-accepting property" it is meant that the organic material has the capability or tendency to accept at least some electronic charge from other type of material that it is adjacent.

The term "reduction potential", expressed in volts, measures the affinity of a substance for an electron, the higher the positive number the greater the affinity. Reduction of hydronium ions into hydrogen gas would have a reduction potential of 0.00 V under standard conditions. The reduction potential of a substance can be conveniently obtained by cyclic voltammetry (CV) and it is measured vs. SCE. The measurement of the reduction potential of a substance can be as following: A Model CHI660 electrochemical analyzer (CH Instruments, Inc., Austin, Tex.) is employed to carry out the electrochemical measurements. Both CV and Osteryoung square-wave voltammetry (SWV) can be used to characterize the redox properties of the substance. A glassy carbon (GC) disk electrode (A=0.071 $cm^2$) is used as working electrode. The GC electrode is polished with 0.05 μm alumina slurry, followed by sonication cleaning in deionized water twice and rinsed with acetone in between water cleaning. The electrode is finally cleaned and activated by electrochemical treatment prior to use. A platinum wire can be used as the counter electrode and the SCE is used as a quasi-reference electrode to complete a standard 3-electrode electrochemical cell. A mixture of acetonitrile and toluene (1:1 MeCN/toluene) or methylene chloride ($MeCl_2$) can be used as organic solvent systems. All solvents used are ultra low water grade (<10 ppm water). The supporting electrolyte, tetrabutylammonium tetrafluoroborate (TBAF) is recrystallized twice in isopropanol and dried under vacuum for three days. Ferrocene (Fc) can be used as an internal standard ($E^{red}_{Fc}$=0.50 V vs. SCE in 1:1 MeCN/toluene, $E^{red}_{Fc}$=0.55 V vs. SCE in $MeCl_2$, 0.1 M TBAF). The testing solution is purged with high purity nitrogen gas for approximately 15 minutes to remove oxygen and a nitrogen blanket is kept on the top of the solution during the course of the experiments. All measurements are performed at ambient temperature of 25±1° C. If the compound of interest has insufficient solubility, other solvents can be selected and used by those skilled in the art. Alternatively, if a suitable solvent system cannot be identified, the electron-accepting material can be deposited onto the electrode and the reduction potential of the modified electrode can be measured.

The electron-accepting layer, including one or more organic materials having a reduction potential greater than −0.5 V vs. SCE and providing more than 50% by volume in the electron-accepting layer, can have both effective carrier injection and effective optical transparency in the tandem OLED. Organic materials suitable for use in the electron-accepting layer include not only simple compounds containing at least carbon and hydrogen, but also include metal complexes, e.g., transition metal complexes having organic ligands and organometallic compounds, as long as their reduction potentials are more positive than −0.5 V vs. SCE. Organic materials for the electron-accepting layer can include small molecules (capable of being deposited by vapor deposition), polymers, or dendrimers, or combinations thereof. It is also important that at least a portion of the electron-accepting layer does not significantly mix with adjacent layers. This can be accomplished by choosing materials having molecular weight high enough to prevent such diffusion. Preferably, the molecular weight of the electron-accepting material is greater than 350. To maintain the proper electron-accepting properties of the layer, it is desirable that the one or more organic materials constitute more than 90% by volume of the electron-accepting layer. For manufacturing simplicity, a single compound can be used for the electron-accepting layer.

Some examples of organic materials having a reduction potential greater than −0.5 V vs. SCE that can be used to form the electron-accepting layer include, but are not limited to, derivatives of hexaazatriphenylene and tetracyanoquinodimethane. A useful thickness of the electron-accepting layer is typically between 3 and 100 nm.

The term "p-type doped organic layer" means that the organic layer has semiconducting properties after doping, and the electrical current through this layer is substantially carried by the holes. When used in the present invention, the optional p-type doped organic layer 435 contains at least one organic host material and one p-type dopant, wherein the organic host material is capable of supporting hole transport. The hole-transporting materials used in conventional OLED devices represent a useful class of host materials for the p-type doped organic layer. Preferred materials include aromatic tertiary amines having at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Other suitable triarylamines substituted with one or more vinyl radicals or comprising at least one active hydrogen-containing group are disclosed by Brantley et al. in U.S. Pat. Nos. 3,567,450 and 3,658,520. A more preferred class of aromatic tertiary amines are those which include at least two aromatic tertiary amine moieties as described by VanSlyke et al. in U.S. Pat. Nos. 4,720,432 and 5,061,569. Nonlimiting examples include as N,N'-di(naphthalene-1-yl)-N,N'-diphenyl-benzidine (NPB) and N,N'-diphenyl-N,N'-bis(3-methylphenyl)-1,1-biphenyl-4,4'-diamine (TPD), and N,N,N',N'-tetranaphthyl-benzidine (TNB). Another preferred class of aromatic amines are dihydrophenazine compounds as described in commonly assigned U.S. patent application Ser. No. 10/390,973 filed Mar. 18, 2003 by Kevin P. Klubek et al., entitled "Cascaded Organic Electroluminescent Devices", the disclosure of which is herein incorporated by reference. The combination of the aforementioned materials is also useful to form the p-typed doped organic layer. More preferably, the organic host material in the p-type doped organic layer 335 includes NPB, TPD, TNB, 4,4',4"-tris(N-3-metylphenyl-N-phenyl-amino)-triphenylamine (m-MTDATA), 4,4',4"-tris(N,N-diphenyl-amino)-triphenylamine (TDATA), or dihydrophenazine compounds, or combinations thereof.

The p-type dopant in the p-type doped organic layer 335 includes oxidizing agents with strong electron-withdrawing properties. "Strong electron-withdrawing properties" means that the organic dopant should be able to accept some electronic charge from the host to form a charge-transfer complex with the host material. Some nonlimiting examples include organic compounds such as 2,3,5,6-tetrafluoro-7,7,8,8-tetracyanoquinodimethane ($F_4$-TCNQ) and other derivatives of 7,7,8,8-tetracyanoquinodimethane (TCNQ), and inorganic oxidizing agents such as iodine, $FeCl_3$, $FeF_3$, $SbCl_5$, some other metal chlorides, and some other metal fluorides. The combination of p-type dopants is also useful to form the p-type doped organic layer 335. The p-type doped concentration is preferably in the range of 0.01-20 vol. %. The thickness of the p-type doped organic layer is typically less than 150 nm, and preferably in the range of about 1 to 100 nm.

The host materials used in the intermediate connectors can comprise small molecule materials or polymeric materials, or combinations thereof. In some instances, the same host material can be used for both n-type and p-type doped organic layers, provided that it exhibits both hole and electron transport properties set forth above. Examples of materials that can be used as host for either the n-type or p-type doped organic layers include, but are not limited to, various anthracene derivatives as described in U.S. Pat. No. 5,972,247, certain carbazole derivatives such as 4,4-bis(9-dicarbazolyl)-biphenyl (CBP), and distyrylarylene derivatives such as 4,4'-bis(2,2'-diphenyl vinyl)-1,1'-biphenyl, and as described in U.S. Pat. No. 5,121,029.

A p-type doped organic layer can form at the interface of the electron-accepting layer and the HTL simply by deposition of the HTL material. In this invention, the materials chosen for the electron-accepting layer and the HTL are such that only a small amount of mixing occurs. That is, it is important that at least some of the electron-accepting layer does not mix with the HTL material.

When used in the present invention, the optional interfacial layer 332 in the intermediate connector 330 is mainly used to stop the possible interdiffusion between materials of the n-typed doped organic layer and the electron-accepting layer. The interfacial layer can be a metal compound or a metal. When used, the layer should be as thin as possible to be effective but reduce optical losses.

The interfacial layer 332 can contain a metal compound selected from the stoichiometric oxides or nonstoichiometric oxides of titanium, zirconium, hafnium, niobium, tantalum, molybdenum, tungsten, manganese, iron, ruthenium, rhodium, iridium, nickel, palladium, platinum, copper, zinc, silicon, or germanium, or combinations thereof. The interfacial layer 332 can contain a metal compound selected from the stoichiometric sulfides or nonstoichiometric sulfides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The interfacial layer 332 can contain a metal compound selected from the stoichiometric selenides or nonstoichiometric selenides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The interfacial layer 332 can contain a metal compound selected from the stoichiometric tellurides or nonstoichiometric tellurides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The interfacial layer 332 can contain a metal compound selected from the stoichiometric nitrides or nonstoichiometric nitrides of titanium, zirconium, hafnium, niobium, tantalum, molybdenum, tungsten, manganese, iron, ruthenium, rhodium, iridium, nickel, palladium, platinum, copper, zinc, gallium, silicon, or germanium, or combinations thereof. The interfacial layer 332 can contain a metal compound selected from the stoichiometric carbides or nonstoichiometric carbides of titanium, zirconium, hafnium, niobium, tantalum, molybdenum, tungsten, manganese, iron, ruthenium, rhodium, iridium, nickel, palladium, platinum, copper, zinc, aluminum, silicon, or germanium, or combinations thereof. Particularly useful metal compounds for use in the interfacial layer 332 can be selected from $MoO_3$, $NiMoO_4$, $CuMoO_4$, $WO_3$, ZnTe, $Al_4C_3$, $AlF_3$, $B_2S_3$, CuS, GaP, InP, or SnTe. Preferably, the metal compound is selected from $MoO_3$, $NiMoO_4$, $CuMoO_4$, or $WO_3$.

When using a metal compound, the thickness of the interfacial layer 432 in the intermediate connector is in the range of from 0.5 nm to 20 nm.

Alternatively, the interfacial layer 332 can include a high work function metal layer. The high work function metal used to form this layer has a work function no less than 4.0 eV and includes Ti, Zr, Nb, Ta, Cr, Mo, W, Re, Fe, Ru, Os, Co, Rh, Ir, Ni, Pd, Pt, Cu, Ag, Au, Zn, Al, In, or Sn, or combinations thereof. Preferably, the high work function metal layer includes Ag, Al, Cu, Au, Zn, In, or Sn, or combinations thereof. More preferably, the high work function metal includes Ag or Al.

When using a high work function metal, the thickness of the interfacial layer 332 in the intermediate connector is in the range of from 0.1 nm to 5 nm.

The electrons on the HOMO of the HTL of an EL unit can be readily injected onto the LUMO of its adjacent electron-accepting layer, and then injected onto the LUMO of the n-type doped organic layer adjacent to the electron-accepting layer. The n-type doped organic layer injects electrons into the ETL of the adjacent EL unit, and the electrons next move into the LEL (luminescent zone) where they recombine with holes to emit light, typically at an emissive dopant site in the LEL. Compared to the prior art intermediate connectors, the electrical potential drop (or voltage drop) across the intermediate connector can be reduced and the optical transparency can be increased. Since the intermediate connector is an organic layer, it can be readily formed at a relatively low temperature. Therefore, the organic layer in each of the intermediate connectors can be preferably formed using a thermal evaporation method.

The overall thickness of the intermediate connectors is typically from 5 nm to 200 nm. If there are more than two intermediate connectors in a tandem OLED, the intermediate connectors can be the same or different from each other in terms of layer thickness, material selection, or both.

As mentioned previously, it is often useful to provide a hole-injecting layer (HIL) between the anode and the HTL. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. Nos. 6,127,004, 6,208,075, and 6,208,077, some aromatic amines, for example, m-MTDATA (4,4',4"-tris[(3-methylphenyl)phenyl-amino]triphenylamine), and inorganic oxides including vanadium oxide (VOx), molybdenum oxide (MoOx), and nickel oxide (NiOx). Alternative hole-injecting materials reportedly useful in organic EL devices are described in EP 0 891 121 A1 and EP 1 029 909 A1. p-Type doped organic materials as described previously for use in the intermediate connector are also a useful class of hole-injecting materials. Hexaazatriphenylene derivatives are also useful HIL materials, as described in U.S. Pat. No. 6,720,573.

The OLED of the present invention is typically provided over a supporting substrate where either the cathode or anode can be in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light-absorbing, or light reflective. Substrates for use in this case include, but are not limited to, glass, plastic, semiconductor materials, silicon, ceramics, and circuit board materials. Of course, it is necessary to provide in these device configurations a light-transparent top electrode.

When EL emission is viewed through the anode 11, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the cathode electrode, the transmissive characteristics of the anode are immaterial and any conductive material can be used, regardless if it is transparent, opaque, or reflective. Example conductors for the present invention include, but are not limited to, gold, iridium, molybdenum, palladium, and platinum. Typical anode materials, transmissive or otherwise, have a work function no less than 4.0 eV. Desired anode materials are commonly deposited by any suitable way such as evaporation, sputtering, chemical vapor deposition, or electrochemical means. Anodes can be patterned using well known photolithographic processes. Optionally, anodes can be polished prior to the deposition of other layers to reduce surface roughness so as to reduce electrical shorts or enhance reflectivity.

When light emission is viewed solely through the anode, the cathode used in the present invention can be comprised of nearly any conductive material. Desirable materials have effective film-forming properties to ensure effective contact with the underlying organic layer, promote electron injection at low voltage, and have effective stability. Useful cathode materials often contain a low work function metal (<4.0 eV) or metal alloy. One preferred cathode material is comprised of an MgAg alloy wherein the percentage of silver is in the range of 1 to 20% by atomic ratio, as described in U.S. Pat. No. 4,885,211. Another suitable class of cathode materials includes bilayers comprising a thin inorganic EIL in contact with an organic layer (e.g., organic EIL, or organic ETL), which is capped with a thicker layer of a conductive metal. Here, the inorganic EIL preferably includes a low work function metal or metal salt and, if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, the cathode should be transparent or nearly transparent. For such applications, metals should be thin or one should use transparent conductive oxides, or include these materials. Optically transparent cathodes have been described in more detail in U.S. Pat. Nos. 4,885,211, 5,247,190, 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, 6,278,236, 6,284,393, and EP 1 076 368. Cathode materials are typically deposited by thermal evaporation, electron beam evaporation, ion sputtering, or chemical vapor deposition. When needed, patterning can be achieved through many well known methods including, but not limited to, through-mask deposition, integral shadow masking, for example as described in U.S. Pat. No. 5,276,380 and EP 0 732 868, laser ablation, and selective chemical vapor deposition.

In the present invention, an electron-injecting layer (EIL) is provided between the cathode and the ETL. n-Type doped organic layers including low work function metal dopants, as described previously for use in the intermediate connector, are a useful class of electron-injecting materials. Referring back to FIG. 2, the important feature of this invention is that the EIL 226.2 is adjacent to ETL 224.2 and contains and electron-transporting material that is different from the electron-transporting material used in the ETL. There are several reasons to select different electron-transporting materials for use in an ETL and the EIL.

First, the electron-transporting material of the ETL can be selected so that the diffusion of the low work function metal dopant is lower than it is in the electron-transporting material of the EIL. Through such selection, the diffusion of low work function metal dopants into the light-emitting layer can be reduced thereby reducing unwanted excited-state quenching. For example, alkali metal dopants have relatively high diffusivity in phenathroline-based electron-transporting materials. If both the EIL 226.2 and ETL 224.2 include primarily phenanthroline derivatives, then the alkali metal dopants can readily diffuse from the EIL 226.2 through ETL 224.2 and into the LEL 223.2. However, if the ETL 224.2 includes primarily metal oxinoid or triazine derivatives, the diffusion of alkali metal dopants is reduced. It is believed that electron-transporting materials having oxygen atoms are particularly effective at binding alkali metal cations and thereby reduce the diffusion of low work function metals such as alkali metals.

Second, the electron-transporting material of the ETL can be selected so that it has a LUMO intermediate between the LEL and the EIL. This can result in lower voltages.

Third, the electron-transporting material of the ETL can be selected so as to alter the recombination zone in the LEL. Ordinarily, recombination occurs near the interface of the LEL and the HTL. In some cases, especially white emitting EL units, the HTL or a portion of the HTL is also doped with an emissive dopant and so the HTL can become a second light-emitting layer. By selecting an electron-transporting material in the ETL that readily promotes electron injection into the LEL (through high electron mobility or relative positioning of LUMO) the relative emission from the LEL or the doped HTL can be adjusted.

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimation "boat" often comprised of a tantalum material, e.g., as described in U.S. Pat. No. 6,237,529, or can be first coated onto a donor sheet and then sublimed in closer proximity to the substrate. Layers with a mixture of materials can use separate sublimation boats or the materials can be premixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357), and inkjet method (U.S. Pat. No. 6,066,357).

Most OLED devices are sensitive to moisture or oxygen, or both, so they are commonly sealed in an inert atmosphere such as nitrogen or argon. In sealing an OLED device in an inert environment, a protective cover can be attached using an organic adhesive, a metal solder, or a low melting temperature glass. Commonly, a getter or desiccant is also provided within the sealed space. Useful getters and desiccants include, alkali and alkaline metals, alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as $SiO_x$, Teflon, and alternating inorganic/polymeric layers are known in the art for encapsulation.

OLED devices of the present invention can employ various well known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters in functional relationship with the light-emitting areas of the display. Filters, polarizers, and anti-glare or anti-reflection coatings can also be provided over a cover or as part of a cover.

White or broadband emission can be combined with color filters to provide full color or multicolor display. The color filters can include red, green, and blue filters. There can also be provided a color system that includes red, green, blue and white filters can be used, e.g., as described in U.S. Patent Application Publication 2004/0113875 A1. In place of white, yellow or cyan can be used. Five or more color systems can also be useful.

The OLED device can have a microcavity structure. In one useful example, one of the metallic electrodes is essentially opaque and reflective; the other one is reflective and semitransparent. The reflective electrode is preferably selected from Au, Ag, Mg, Ca, or alloys thereof. Because of the presence of the two reflecting metal electrodes, the device has a microcavity structure. The strong optical interference in this structure results in a resonance condition. Emission near the resonance wavelength is enhanced and emission away from the resonance wavelength is depressed. The optical path length can be tuned by selecting the thickness of the organic layers or by placing a transparent optical spacer between the electrodes. For example, an OLED device of this invention can have ITO spacer layer placed between a reflective anode and the organic EL media, with a semitransparent cathode over the organic EL media.

The present invention can be employed in most OLED device applications. These include very simple structures comprising a single anode and cathode to more complex devices, such as area color displays, passive matrix displays comprised of orthogonal arrays of anodes and cathodes to form pixels, and active matrix displays where each pixel is controlled independently, for example, with thin film transistors (TFTs). The invention can also be employed for devices where the OLED is used as a light source, for example, in solid-state lighting or backlights for LCD displays.

EXAMPLES

The following examples are presented for a further understanding of the present invention. The EL characteristics of all the fabricated devices were evaluated using a constant current source (KEITHLEY 2400 SourceMeter) and a photometer (PHOTO RESEARCH SpectraScan PR 650) at the room temperature. The colors are reported using Commission Internationale de l'Eclairage (CIE) coordinates.

Example 1

Comparative

The preparation of a conventional OLED is as follows:
A ~1.1 mm thick glass substrate coated with a transparent indium-tin-oxide (ITO) conductive layer was cleaned and dried using a commercial glass scrubber tool. The thickness of ITO was about 42 nm and the sheet resistance of the ITO was about 68 Ω/square. The ITO surface was subsequently treated with oxidative plasma to condition the surface as an anode. A layer of CFx, 1 nm thick, was deposited on the clean ITO surface as the hole-injecting layer by decomposing $CHF_3$ gas in an RF plasma treatment chamber. The substrate was then transferred into a vacuum deposition chamber for deposition of all other layers on top of the substrate. The following layers were deposited over the CFx layer in the following sequence by evaporation from heated boats under a vacuum of approximately $10^{-6}$ Torr:
   a) as HTL, a 60 nm thick layer of 4,4'-Bis[N-(1-naphthyl)-N-phenylamino]biphenyl (NPB);
   b) as a yellow light-emitting layer, a 20 nm thick layer of NPB doped with 3% by volume Compound 1 (yellow light-emitting dopant) and 20% by volume Compound 2 as stabilizer Compound 1

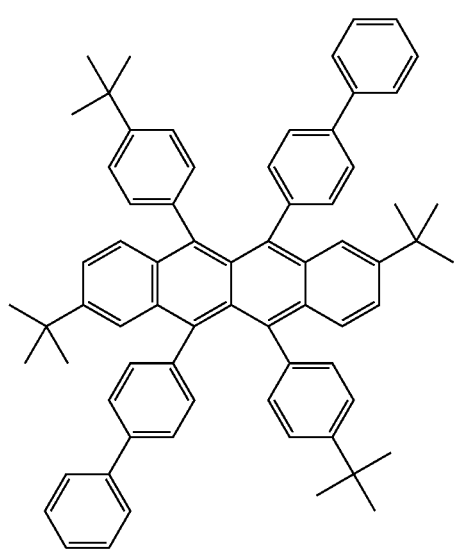

Compound 2

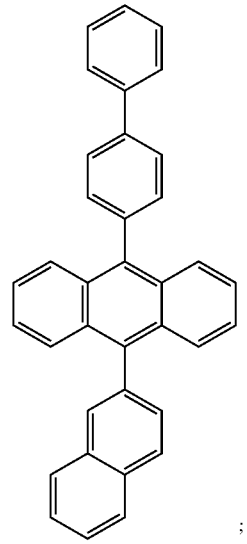

c) as a blue light-emitting layer, a 20 nm thick layer of Compound 2 with 1% by volume Compound 3 (blue light-emitting dopant) and 6% by volume NPB co-dopant forms a blue emitting layer Compound 3

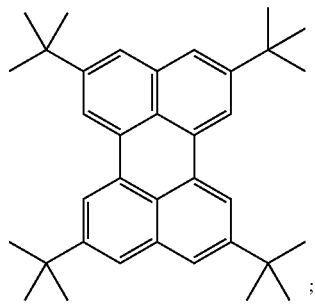

d) as an EIL, a 25 nm thick layer of the electron-transporting material tris(8-quinolinolato)aluminum(III) (Alq) doped with 2% by volume Li metal; and
e) as the cathode, 200 nm thick layer of aluminum.

After the deposition of these layers, the device was transferred from the deposition chamber into a dry box (VAC Vacuum Atmosphere Company) for encapsulation. The OLED has an emission area of 10 $mm^2$. The EL performance data are summarized in Table 1.

Example 2

Comparative

An OLED was constructed with similar fabrication methods to those used in Example 1, except that the EIL was made using 25 nm 4,7-diphenyl-1,10-phenanthroline (also known as bathophen or Bphen) as the electron-transporting material which was doped with 1% by volume Li. The EL performance data are summarized in Table 1.

Examples 3 and 4

Examples 3 and 4 were similar to Example 2 except that the Bphen contained 2% and 3% by volume Li, respectively. The EL performance data are summarized in Table 1.

Example 5

Invention

An OLED was constructed with similar fabrication methods to those used in Example 3, except that after depositing the 20 nm blue emitting layer, a 5 nm thick ETL of Alq was deposited. Then the EIL of 25 nm Bphen+2% by volume Li was deposited. The EL performance data are summarized in Table 1.

Example 6

Invention

An OLED was constructed with similar fabrication methods to those used in Example 5, except that the Alq ETL was 10 nm thick. The EL performance data are summarized in Table 1. The voltages have been corrected for voltage drop due to ITO contact resistance.

TABLE 1

| Example | Drive voltage at 20 mA/cm$^2$ (V) | Luminance yield (cd/A) | Chromaticity (CIEx, CIEy) |
|---|---|---|---|
| 1 - comparison | 5.4 | 9.3 | 0.29, 0.31 |
| 2 - comparison | 4.7 | 15.4 | 0.46, 0.47 |
| 3 - comparison | 3.6 | 15.9 | 0.39, 0.41 |
| 4 - comparison | 3.6 | 16.0 | 0.39, 0.41 |
| 5 - inventive | 4.3 | 10.6 | 0.30, 0.33 |
| 6 - inventive | 5.5 | 10.8 | 0.30, 0.33 |

Figure 4:
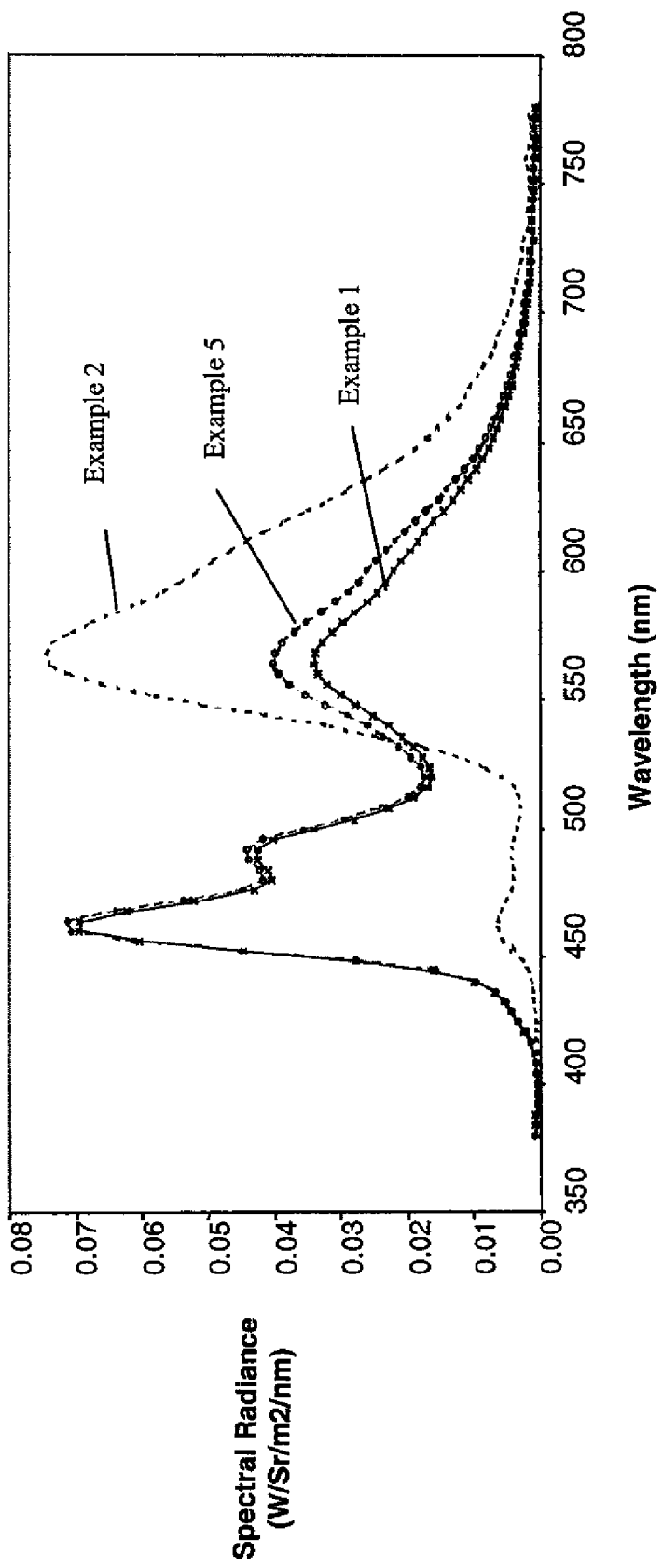
FIG. 4 is a graph showing the EL spectra of an OLED of the present invention along with two comparisons.
Figure 5:
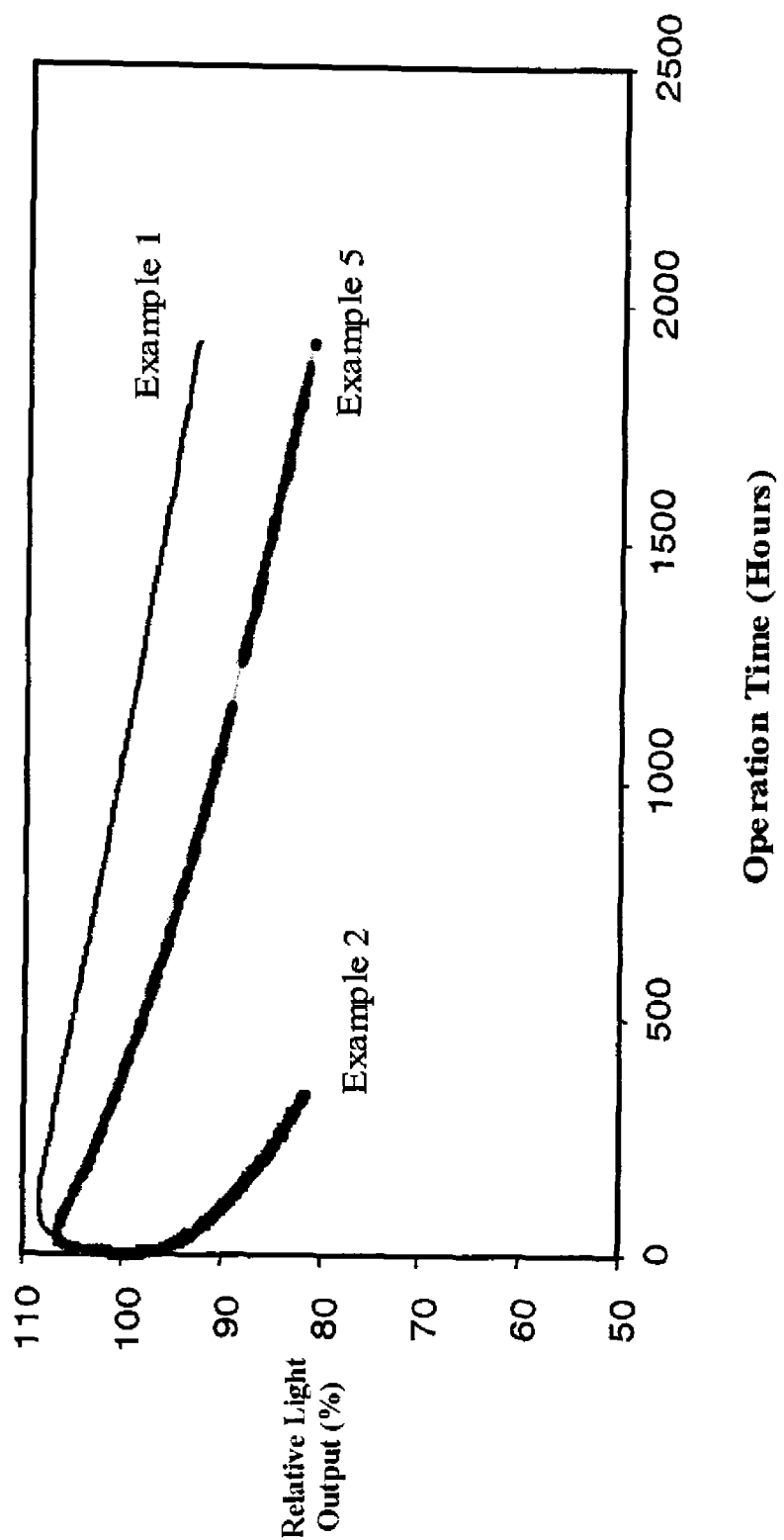
FIG. 5 is a graph showing the luminance stability of an OLED of the present invention along with two comparisons.

In addition to the data provided in Table 1, EL spectra of the devices in Example 1, Example 2 and Example 5 are shown in FIG. 4. FIG. 5 shows the relative luminance change as a function of aging time for Examples 1, 2, and 5. The accelerating aging test was done at 20 mA/cm$^2$ constant current density.

Discussion of Examples 1-6 based on data in Table 1 and FIGS. 4 and 5

Although comparative Example 1 using Li doped Alq has a very acceptable white color (near D65) and effective lifetime, there is a need to reduce the driving voltage. Comparative Examples 2-4 show that a Li doped Bphen EIL can significantly reduce the drive voltage. However, the color is highly shifted to yellow and unacceptable for use in a white OLED. Although the luminance yield is high in terms of cd/A, this is misleading because of the large color change to yellow. There is very little emission from the blue layer. In addition, as shown in comparative Example 2, the stability of the Li-doped Bphen device is very poor (see FIG. 5). Although not shown, the color shifts even further as the device of Example 2 ages.

Inventive Examples 5 shows that by inserting an Alq layer between the Li-doped Bphen and the blue light-emitting layer, the drive voltage is reduced relative to comparative Example 1, the white color is still very effective, and the luminance yield is slightly better. The lifetime of inventive Example 5 is also much better than comparative Example 2. Although the lifetime of Example 5 is not quite as effective as that of comparative Example 1, it can be acceptable for certain applications such as small portable displays. In such case, the benefits lower drive voltage and increased luminance can greatly outweigh the decrease in lifetime.

The Li-doped Bphen provides a better EIL than Li-doped Alq from the standpoint of lowering drive voltage. However, it is believed that the high diffusivity of Li in Bphen is disadvantaged for stability and providing an effective white color. By selecting an ETL electron-transporting material that is different from the EIL electron-transporting material, an excellent compromise between drive voltage and stability can be achieved with the maintenance of desired emission color.

The invention has been described in detail with particular reference to certain preferred embodiments thereof, but it will be understood that variations and modifications can be effected within the spirit and scope of the invention.

Parts List

100 tandem OLED
110 anode
120.1 first EL unit
120.2 second EL unit
120.(N−1) (N−1)$^{th}$ EL unit
120.N Nh EL unit
130.1 first intermediate connector
130.2 second intermediate connector
130.(N−1) (N−1)$^{th}$ intermediate connector
170 cathode
180 voltage/current source
190 electrical conductors
200 tandem OLED having two EL units
210 anode
220.1 first EL unit
220.2 second EL unit
221.1 HIL of the 1$^{st}$ EL unit
222.1 HTL of the 1$^{st}$ EL unit
222.2 HTL of the 2$^{nd}$ EL unit
223.1 LEL of the 1$^{st}$ EL unit
223.2 LEL of the 2$^{nd}$ EL unit
224.1 ETL of the 1$^{st}$ EL unit
224.2 ETL of the 2$^{nd}$ EL unit
226.2 EIL of the 2$^{nd}$ EL unit
230.1 intermediate connector
231.1 n-type doped organic layer of the intermediate connector
233.1 electron-accepting layer of the intermediate connector
270 cathode Parts List (con't)

330 intermediate connector
331 n-type doped organic layer
332 interfacial layer
333 electron-accepting layer
335 p-type doped organic layer

The invention claimed is:

1. An OLED device, comprising:
a) an anode;
b) a cathode;
c) multiple light-emitting layers wherein at least one light emitting layer is an organic blue light-emitting layer disposed between the anode and the cathode;
d) an electron-transporting layer in direct contact with the blue light-emitting layer and disposed between the blue light-emitting layer and the cathode, such electron-transporting layer including a first electron-transporting material;

e) an electron-injecting layer disposed between the electron-transporting layer and the cathode, such electron-injecting layer including a metal dopant having a work function less than 4.0 eV and an electron-transporting material that is different from the first electron-transporting material, wherein the first electron-transporting material has a LUMO between that of the LUMO of the light-emitting layer and the electron-transporting material of the electron-injecting layer;

f) an intermediate connector disposed between the light-emitting layers, the intermediate connector including an electron-accepting layer with an organic material, wherein the reduction potential of the organic material is greater than −0.1V vs. SCE; and wherein the device produces a broadband light from the multiple light-emitting layers.

2. The OLED device of claim 1 wherein the metal dopant is an alkali metal, an alkaline earth metal, or a rare earth metal, or combinations thereof.

3. The OLED device of claim 1 wherein the metal dopant has a lower diffusivity in the first electron-transporting material than it has in the electron-transporting material of the electron-injecting layer.

4. The OLED device of claim 1 wherein the broadband light is white light having a chromaticity of CIE x=0.31±0.05 and CIE y=0.33±0.05.

5. The OLED device of claim 1 wherein the electron-transporting material of the electron-injecting layer includes one or more compounds selected from the group including metal chelated oxinoid compounds, butadiene derivatives, benzazole derivatives, oxadiazole derivatives, triazole derivatives, naphthacene derivatives, pyridinethiadiazole derivatives, triazine derivatives, silole derivatives, pyridine derivatives, and phenanthroline derivatives.

6. The OLED device of claim 1 wherein the electron-transporting material of the electron-injecting layer includes a mixture of electron-transporting compounds.

7. The OLED device of claim 6 wherein one of the compounds of the mixture of electron-transporting compounds is also used in the electron-transporting layer.

8. The OLED device of claim 1 wherein the electron-transporting layer includes a metal oxinoid derivative and the electron-injecting layer includes a phenanthroline derivative.

9. The OLED device of claim 1 further including a hole-injecting layer provided adjacent to the anode.

10. The OLED device of claim 9 wherein the hole-injecting layer includes a hole-transporting material and a p-type dopant.

11. The OLED device of claim 9 wherein the hole-injecting layer includes a material having a reduction potential greater than −0.5 V vs. a Saturated Calomel Electrode.

12. The OLED device of claim 1 wherein the first electron-transporting material contains an oxygen atom.

13. The OLED device of claim 1 wherein the first electron-transporting material is a metal oxinoid compound.

14. The OLED device of claim 1 wherein the first electron-transporting material includes a triazine compound.

15. The OLED device of claim 1 wherein the intermediate connector includes an n-type doped organic layer.

* * * * *